(12) United States Patent
Katrak (10) Patent No.: US 10,261,115 B2
(45) Date of Patent: Apr. 16, 2019

(54) VOLTAGE MONITORING SYSTEM UTILIZING A COMMON CHANNEL AND EXCHANGED ENCODED CHANNEL NUMBERS TO CONFIRM VALID VOLTAGE VALUES

(71) Applicant: LG Chem, Ltd., Seoul (KR)

(72) Inventor: Kerfegar K. Katrak, Fenton, MI (US)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 15/657,357

(22) Filed: Jul. 24, 2017

(65) Prior Publication Data

US 2019/0025351 A1    Jan. 24, 2019

(51) Int. Cl.
*G01R 19/25* (2006.01)
*G01R 31/3835* (2019.01)
*H01M 10/48* (2006.01)

(52) U.S. Cl.
CPC ..... *G01R 19/2513* (2013.01); *G01R 31/3835* (2019.01); *H01M 10/482* (2013.01)

(58) Field of Classification Search
CPC ................................................ G01R 19/2513
USPC ...................................................... 320/143
See application file for complete search history.

(56) References Cited

U.S. PATENT DOCUMENTS

| 8,253,419 | B2 | 8/2012 | Heeringa et al. | |
|---|---|---|---|---|
| 9,444,332 | B2 * | 9/2016 | Bizjak | H02M 3/156 |
| 9,935,552 | B2 * | 4/2018 | Katrak | H02J 7/0065 |
| 2008/0126812 | A1 * | 5/2008 | Ahmed | H04N 19/61 |
| | | | | 713/189 |

OTHER PUBLICATIONS

U.S. Appl. No. 15/657,305, filed Jul. 24, 2017 entitled Voltage Monitoring System.
U.S. Appl. No. 15/657,441, filed Jul. 24, 2017 entitled Voltage Monitoring System Utilizing First and Second Banks of Channels and Exchanged Channel Numbers For Taking Redundant Safe Action.

* cited by examiner

*Primary Examiner* — Edward Tso
*Assistant Examiner* — Ahmed H Omar
(74) *Attorney, Agent, or Firm* — Buckert Patent & Trademark Law Firm PC; John F. Buckert (57) ABSTRACT

A voltage monitoring system having a microcontroller with first and second monitoring applications and a hardware abstraction layer is provided. The hardware abstraction layer sends a second encoded channel number and a first measured voltage value to the first monitoring application. The first monitoring application sends the second encoded channel number to the second monitoring application. The hardware abstraction layer sends a fourth encoded channel number and a second measured voltage value to the second monitoring application. The second monitoring application stores the second measured voltage value in the memory device if the fourth encoded channel number is equal to a first expected encoded channel number, and the second encoded channel number is equal to a second expected encoded channel number.

18 Claims, 11 Drawing Sheets

FIRST TABLE 500

| ENCODED CHANNEL NUMBER | CHANNEL NUMBER |
|---|---|
| D4 | 10 |

SECOND TABLE 520

| CHANNEL NUMBER | ENCODED CHANNEL NUMBER |
|---|---|
| 10 | D4 |

THIRD TABLE 540

| EXPECTED ENCODED CHANNEL NUMBER | EXPECTED ENCODED CHANNEL NUMBER |
|---|---|
| D4 | 71 |

FOURTH TABLE 560

| ENCODED CHANNEL NUMBER | CHANNEL NUMBER |
|---|---|
| 71 | 2 |

FIFTH TABLE 580

| CHANNEL NUMBER | ENCODED CHANNEL NUMBER |
|---|---|
| 2 | 71 |

SIXTH TABLE 600

| EXPECTED ENCODED CHANNEL NUMBER | EXPECTED ENCODED CHANNEL NUMBER |
|---|---|
| 71 | D4 |

VOLTAGE MONITORING SYSTEM UTILIZING A COMMON CHANNEL AND EXCHANGED ENCODED CHANNEL NUMBERS TO CONFIRM VALID VOLTAGE VALUES

BACKGROUND

The inventor herein has recognized a need for an improved voltage monitoring system that utilizes first and second monitoring applications that exchange encoded channel numbers with one another that are associated with a first common channel in a first bank of channels and a first common channel in a second bank of channels, respectively, of an analog-to-digital converter to confirm that the first and second monitoring applications are reliably obtaining desired voltage values from the first common channel in the first bank of channels and the first common channel in the second bank of channels, respectively, which are electrically coupled together.

SUMMARY

A voltage monitoring system in accordance with an exemplary embodiment is provided. The voltage monitoring system includes a microcontroller having an analog-to-digital converter and a memory device. The microcontroller further includes first and second monitoring applications and a hardware abstraction layer. The analog-to-digital converter has a first bank of channels and a second bank of channels. The first bank of channels includes a first common channel. The second bank of channels includes a first common channel that is electrically coupled to the first common channel of the first bank of channels. The first common channel of the first bank of channels is further electrically coupled to a voltage source. The first common channel of the second bank of channels is further electrically coupled to the voltage source. The first monitoring application sends a first request message to the hardware abstraction layer that requests a first measured voltage value from the first common channel of the first bank of channels. The first request message has a first encoded channel number associated with the first common channel of the first bank of channels. The hardware abstraction layer determines a first channel number based on the first encoded channel number. The first channel number is associated with the first common channel of the first bank of channels. The hardware abstraction layer obtains the first measured voltage value associated with the first channel number. The hardware abstraction layer determines a second encoded channel number based on the first channel number. The hardware abstraction layer sends a first response message having the second encoded channel number and the first measured voltage value therein to the first monitoring application. The first monitoring application sends a first exchanged message having the second encoded channel number and the first measured voltage value to the second monitoring application. The second monitoring application sends a second request message to the hardware abstraction layer that requests a second measured voltage value from the first common channel of the second bank of channels. The second request message has a third encoded channel number associated with the first common channel of the second bank of channels. The hardware abstraction layer determines a third channel number based on the third encoded channel number. The third channel number is associated with the first common channel of the second bank of channels. The hardware abstraction layer obtains a second measured voltage value associated with the third channel number. The hardware abstraction layer determines a fourth encoded channel number based on the third channel number. The hardware abstraction layer sends a second response message having the fourth encoded channel number and the second measured voltage value therein to the second monitoring application. The second monitoring application sends a second exchanged message having the fourth encoded channel number to the first monitoring application. The second monitoring application stores the second measured voltage value in the memory device as a first valid voltage value if the fourth encoded channel number is equal to a first expected encoded channel number, and the second encoded channel number from the first monitoring application is equal to a second expected encoded channel number.

DETAILED DESCRIPTION

Figure 1:
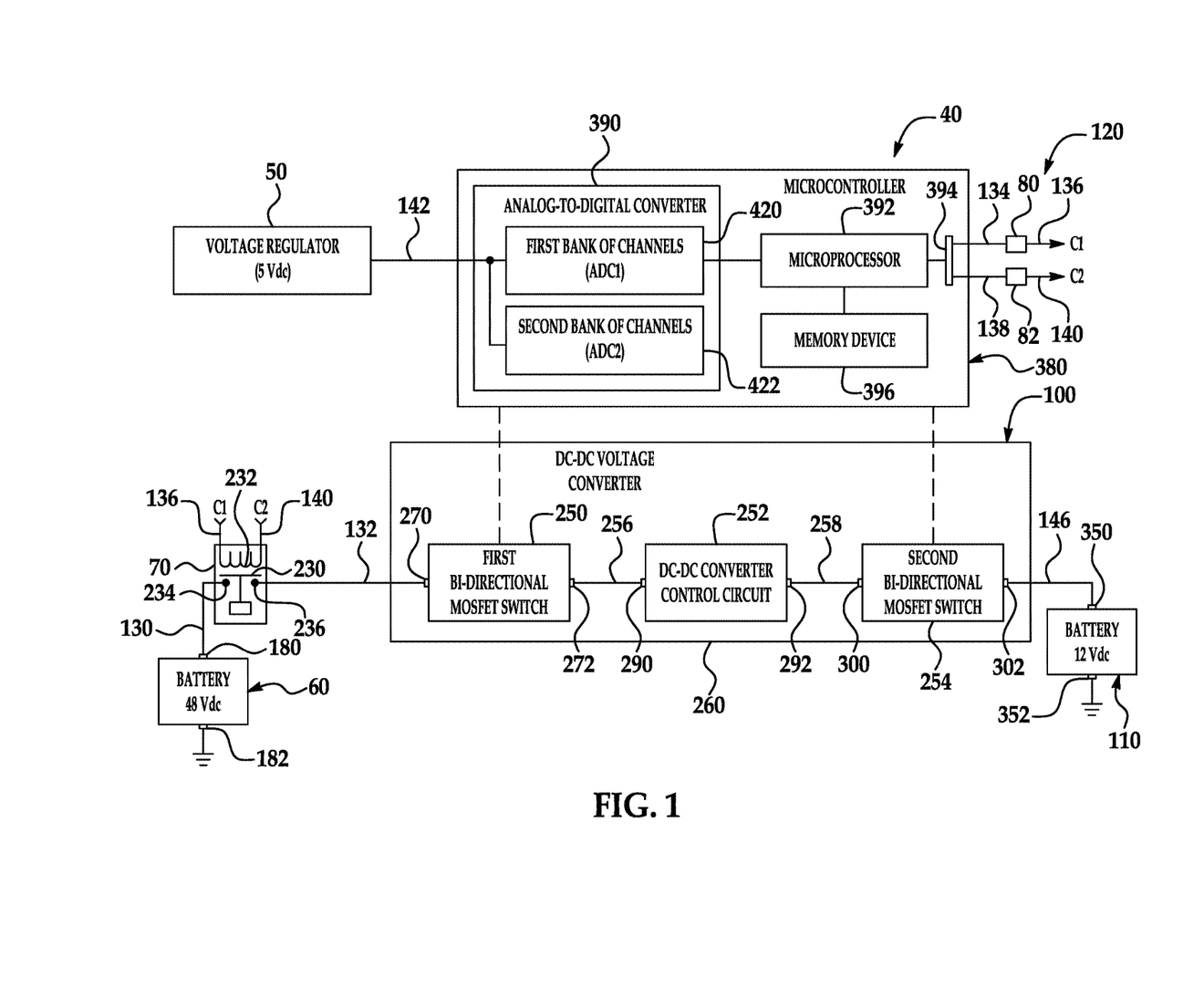
FIG. 1 is a schematic of a vehicle having a voltage monitoring system in accordance with an exemplary embodiment.

Referring to FIG. 1, a vehicle 20 is provided. The vehicle 20 includes a voltage regulator 50, a battery 60, a contactor 70, voltage drivers 80, 82, a DC-DC voltage converter 100, a battery 110, a voltage monitoring system 120, and electrical lines 130, 132, 134, 136, 138, 140, 142, 144, 146.

An advantage of the voltage monitoring system 120 is that the system 120 utilizes first and second monitoring applications that exchange encoded channel numbers with one another that are associated with a first common channel in a first bank of channels and a first common channel in a second bank of channels, respectively, of an analog-to-digital converter 390 to confirm that the first and second monitoring applications are reliably obtaining desired voltage values from the first common channel in the first bank of channels and the first common channel in the second bank of channels, respectively, which are electrically coupled together. Further, if the system 120 detects a problem with the encoded channel numbers, the system 120 can initiate safety steps.

For purposes of understanding, a node is a region or a location in an electrical circuit.

The battery 60 includes a positive terminal 180 and a negative terminal 182. In an exemplary embodiment, the battery 60 generates 48 Vdc between the positive terminal 180 and the negative terminal 182. The positive terminal 180 is electrically coupled to a node 234 of the contactor 70. The negative terminal 182 is electrically coupled to electrical ground.

The contactor 70 has a contact 230, a contactor coil 232, a first node 234, and a second node 236. The first node 234 is electrically coupled to the positive terminal 180 of the battery 60 utilizing the electrical line 130. The second node 236 is electrically coupled to the first node 270 of the first bi-directional MOSFET switch 250 of the DC-DC voltage converter 100 utilizing the electrical line 132. When the microcontroller 380 generates first and second control signals that are received by the voltage drivers 80, 82, respectively, the contactor coil 232 is energized which transitions the contact 230 to a closed operational state. Alternately, when the microcontroller 380 generates third and fourth control signals that are received by the voltage drivers 80, 82, respectively, the contactor coil 232 is de-energized which transitions the contact 230 to an open operational state. In an exemplary embodiment, the third and fourth control signals can each be a ground voltage level.

The voltage drivers 80, 82 are provided to energize or de-energize the contactor coil 232. The voltage driver 80 is electrically coupled to an input-output device 394 of the microcontroller 380 utilizing the electrical line 134. The voltage driver 80 is further electrically coupled to a first end of the contactor coil 232 utilizing the electrical line 136. The voltage driver 82 is electrically coupled to the input-output device 394 of the microcontroller 380 utilizing the electrical line 138. The voltage driver 82 is further electrically coupled to a second end of the contactor coil 232 utilizing the electrical line 140.

The DC-DC voltage converter 100 includes a first bi-directional MOSFET switch 250, a DC-DC converter control circuit 252, and a second bi-directional MOSFET switch 254, electrical lines 256, 258, and a housing 260. The housing 260 holds the first bi-directional MOSFET switch 250, the DC-DC converter control circuit 252, and the second bi-directional MOSFET switch 254 therein. In a first operational mode, the DC-DC voltage converter 100 outputs a voltage from a second node 302 for charging the battery 110. In a second operational mode, the DC-DC voltage converter 100 outputs a voltage at a first node 270 for charging the battery 60.

Figure 2:
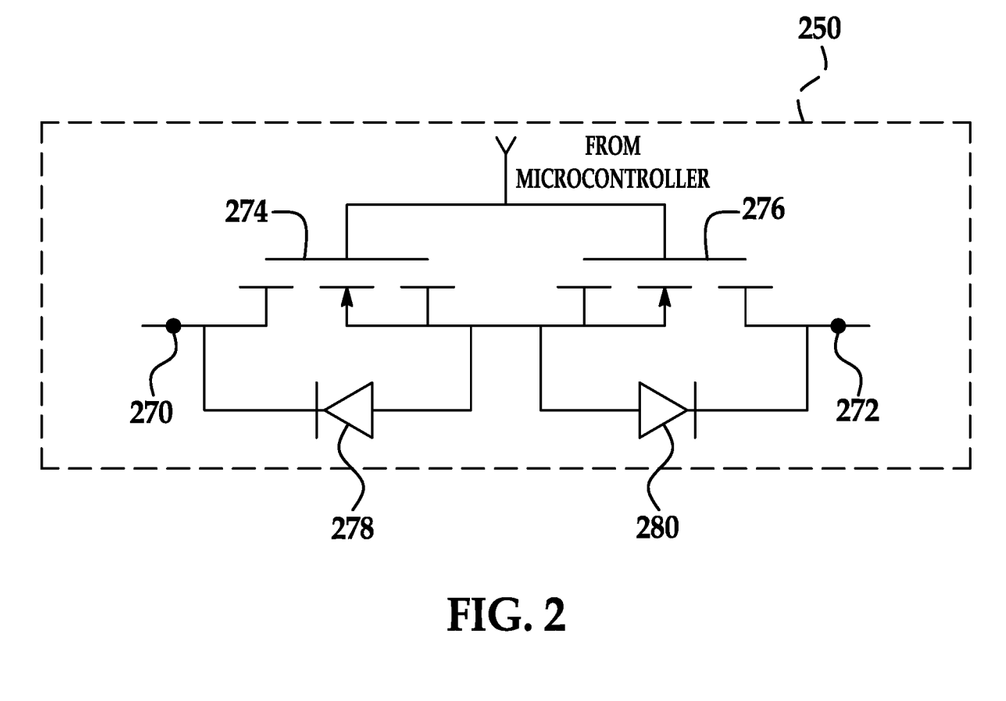
FIG. 2 is a schematic of a bi-directional MOSFET switch utilized in the vehicle of FIG. 1.

Referring to FIGS. 1 and 2, in an exemplary embodiment, the first bi-directional MOSFET switch 250 includes a first node 270, a second node 272, MOSFET switches 274, 276, and diodes 278, 280. Of course, in an alternative embodiment, the first bi-directional MOSFET switch 250 could be replaced with another type of bi-directional switch having desired voltage and current capabilities. The first node 270 is electrically coupled to the second node 236 of the contactor 70. The second node 272 is electrically coupled to a first node 290 of the DC-DC converter control circuit 252. When the microcontroller 380 generates a first control signal that is received by the first bi-directional MOSFET switch 250 (or that is received by a controller or a microprocessor within the DC-DC voltage converter 100 that is operably coupled to the switch 250), the microcontroller 380 induces the switch 250 to transition to a closed operational state. When the microcontroller 380 generates a second control signal, the microcontroller 380 induces the switch 250 to transition to an open operational state. In an exemplary embodiment, the second control signal is a ground level control signal.

The DC-DC converter control circuit 252 has a first node 290 and a second node 292. The DC-DC converter control circuit 252 can convert a DC voltage received at the first node 290 to another DC voltage output at the second node 292, based on a first control signal from the microcontroller 380. Alternately, the DC-DC converter control circuit 252 can convert a DC voltage received at the second node 292 to another DC voltage that is output at the first node 290, based on a second control signal from the microcontroller 380.

The second bi-directional MOSFET switch 254 includes a first node 300 and a second node 302. The first node 300 is electrically coupled to the second node 292 of the DC-DC converter control circuit 252 utilizing the electrical line 258. The second node 302 is electrically coupled to the battery 110 utilizing the electrical line 146. In an exemplary embodiment, the second bi-directional MOSFET switch 254 has an identical structure as the first bi-directional MOSFET switch 250. Of course, in an alternative embodiment, the second bi-directional MOSFET switch 254 could be replaced with another type of bi-directional switch having desired voltage and current capabilities. When the microcontroller 380 generates a first control signal that is received by the second bi-directional MOSFET switch 254 (or that is received by a controller or a microprocessor within the DC-DC voltage converter 100 that is operably coupled to the switch 254), the microcontroller 380 induces the switch 254 to transition to a closed operational state. When the microcontroller 380 generates a second control signal, the microcontroller 380 induces the switch 254 to transition to an open operational state. In an exemplary embodiment, the second control signal is a ground level control signal.

The battery 110 includes a positive terminal 350 and a negative terminal 352. In an exemplary embodiment, the battery 110 generates 12 Vdc between the positive terminal 350 and the negative terminal 352. The positive terminal 350 is electrically coupled to the second node 302 of the second bi-directional MOSFET switch 254 of the DC-DC voltage converter 100. The negative terminal 352 is electrically coupled to an electrical ground, which may be electrically isolated from the electrical ground associated with the battery 60.

Figure 10:
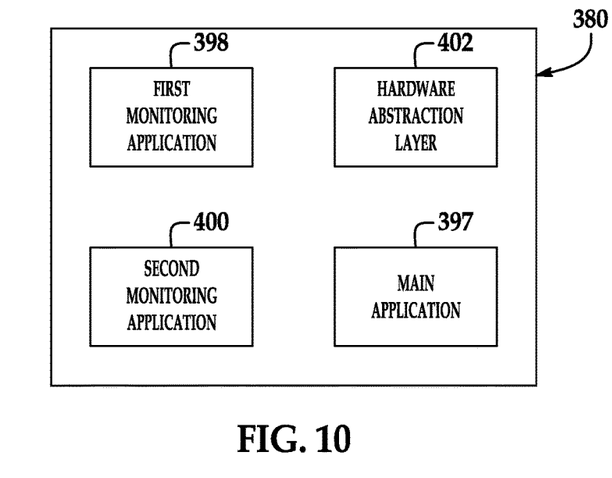
FIG. 10 is a block diagram illustrating a main program, first and second monitoring applications, and a hardware abstraction layer that are utilized by the voltage monitoring system of FIG. 1.

Referring to FIGS. 1 and 10, the voltage monitoring system 120 is utilized to monitor a voltage from a voltage source, such as the voltage regulator 50 for example. The voltage monitoring system 120 includes a microcontroller 380. The microcontroller 380 has an analog-to-digital converter 390, a microprocessor 392, an input-output device 394, a memory device 396, a main application 397, first and second monitoring applications 398, 400, and a hardware abstraction layer 402.

Figure 3:
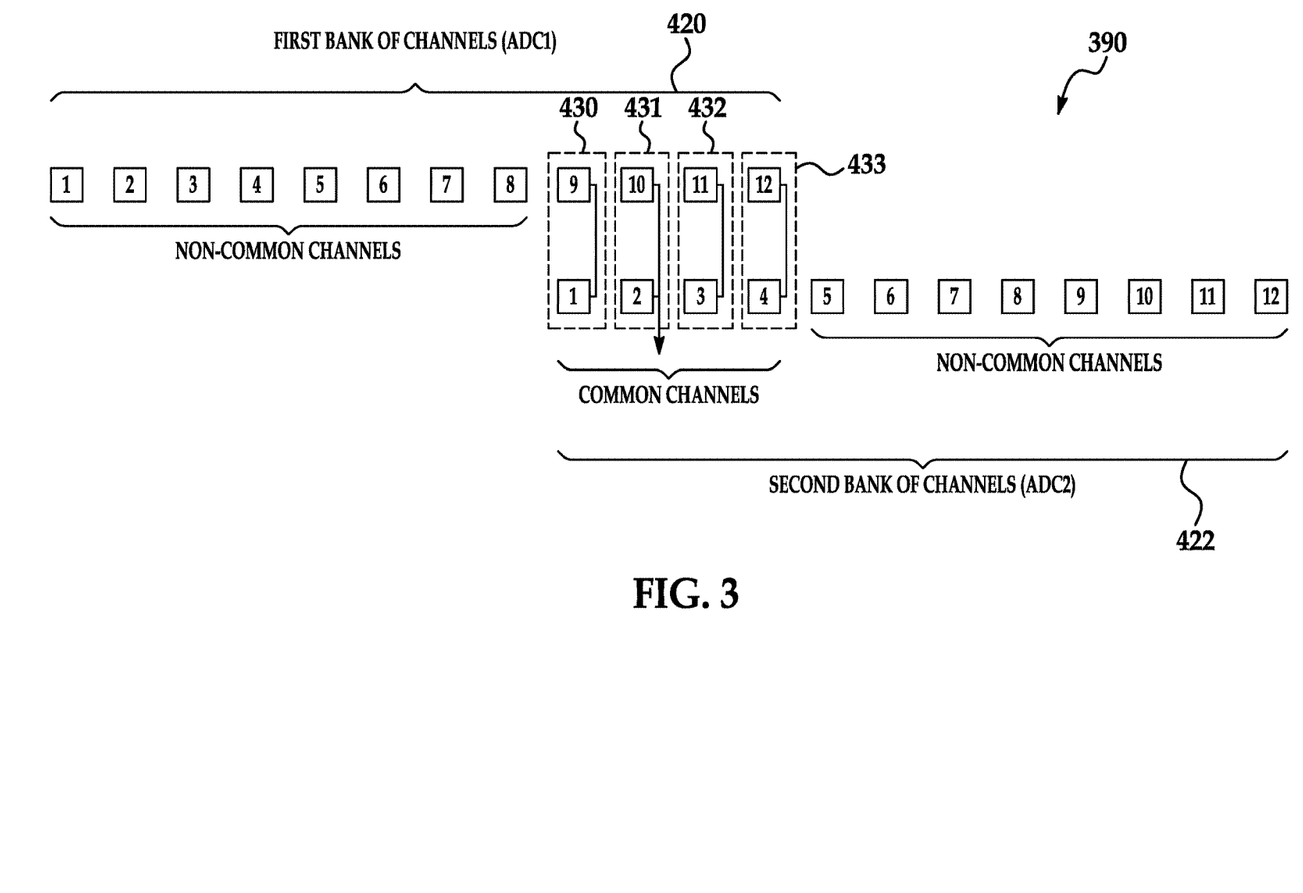
FIG. 3 is a schematic of a first bank of channels and a second bank of channels in an analog-to-digital converter utilized in the voltage monitoring system of FIG. 1.

Referring to FIGS. 1 and 3, the analog-to-digital converter 390 includes a first bank of channels 421 (also referred to as "ADC1") and a second bank of channels 422 (also referred to as "ADC2"). The first bank of channels 420 includes non-common channels 1, 2, 3, 4, 5, 6, 7, 8 and common channels 9, 10, 11 and 12. Further, the second bank of channels 422 includes non-common channels 5, 6, 7, 8, 9, 10, 11, 12 and common channels 1, 2, 3, 4.

The common channel 9 of the first bank of channels 420 is electrically coupled to the common channel 1 of the second bank of channels 422 and are jointly referred to as a common channel 430 in the first and second bank of channels 420, 422.

The common channel 10 of the first bank of channels 420 is electrically coupled to the common channel 2 of the second bank of channels 422 and are jointly referred to as a common channel 431 in the first and second bank of channels 420, 422. The channel 10 of the first bank of channels 420 measures a voltage from the voltage regulator 50 and generates a voltage value therefrom that can be obtained by reading the channel 10 of the first bank of channels 420. The common channel 2 of the second bank of channels 422 measures the voltage from the voltage regulator 50 and generates a voltage value therefrom that can be obtained by the microprocessor 392 reading the common channel 2 of the second bank of channels 422. It is noted that the voltage values obtained by the channel 10 of the first bank of channels 420 and the common channel 2 of the second bank of channels 422 can have different values from one another within the measurement resolution (referred to as a "first difference value" herein) of the analog-to-digital converter 390.

The common channel 11 of the first bank of channels 420 is electrically coupled to the common channel 3 of the second bank of channels 422 and are jointly referred to as common channel 432 in the first and second bank of channels 420, 422.

The common channel 12 of the first bank of channels 420 is electrically coupled to the common channel 4 of the second bank of channels 422 and are jointly referred to as a common channel 433 in the first and second bank of channels 420, 422.

The microcontroller 380 is programmed to monitor voltages (described in flowcharts herein) utilizing the microprocessor 392 which executes software instructions stored in the memory device 396. The microprocessor 392 is operably coupled to the analog-to-digital converter 390, the input-output device 394, and the memory device 396. The microprocessor 392 is further operably coupled to the voltage drivers 80, 82, and the contactor 70. The input-output device 394 can output digital control signals that are received by the voltage drivers 80, 82 for controlling the operation of the contactor 70. The memory device 396 stores data, the main application 397, the first monitoring application 398, the second monitoring application 400, the hardware abstraction layer 402, the first table 500 (shown in FIG. 4) and the second table 520 (shown in FIG. 5), the third table 540 (shown in FIG. 6), the fourth table 560 (shown in FIG. 7), the fifth table 580 (shown in FIG. 8), and the sixth table 600 (shown in FIG. 9) therein.

Figure 6:
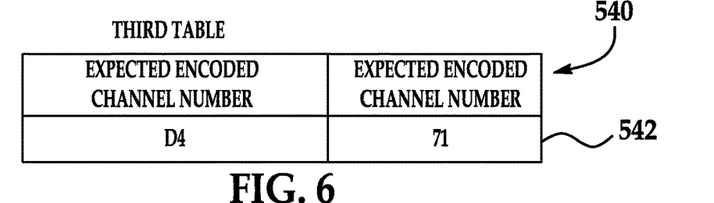
FIG. 6 is a third table that is utilized by the first monitoring application of the voltage monitoring system of FIG. 1.

Referring to FIGS. 1 and 6, the microprocessor 392 executes the main application 397, the first and second monitoring applications 398, 400, and a hardware abstraction layer 402. The main application 397, the first and second monitoring applications 398, 400, and the hardware abstraction layer 402 are implemented with software instructions that allow communication between the first and second monitoring applications 398, 400 and the hardware abstraction layer 402 for obtaining voltage values from the analog-to-digital converter 390. The hardware abstraction layer 402 is associated with the analog-to-digital converter 390 and extracts voltage values generated by the analog-to-digital converter 390. In an exemplary embodiment, the hardware abstraction layer 402 is a layer of programming (e.g., low-level programs or applications) that allows the main application 397, the first and second monitoring applications 398, 400, and an operating system (stored in the memory device 396) of the microcontroller 380 to interact with the analog-to-digital converter 390 at a general or abstract level rather than at a detailed hardware level. The hardware abstraction layer 402 can be called from the main application 397, the first and second monitoring applications 398, 400, or from the operating system to obtain voltage values from the analog-to-digital converter 390.

Figure 4:
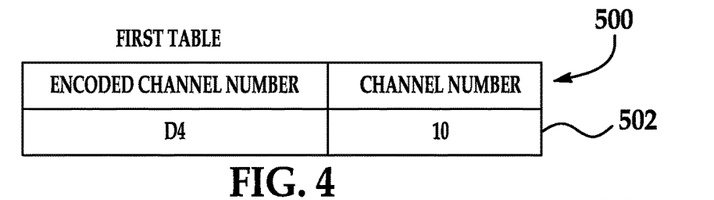
FIG. 4 is a first table that is utilized by a first monitoring application of the voltage monitoring system of FIG. 1.

Referring to FIG. 4, a first table 500 that is utilized by the first monitoring application 398 in the voltage monitoring system 120 is illustrated. The first table 500 includes a record 502. The record 502 has a first encoded channel number D4 (which is a hexadecimal value) and a first channel number 10 (which is the decimal value). The first encoded channel number D4 is associated with the common channel 10 (of the common channel 431) in the first bank of channels 420. The first channel number 10 is associated with the common channel 10 (of the common channel 431) in the first bank of channels 420. In an alternative embodiment, the common channel 10 in the first bank of channels 420 could be electrically coupled to another voltage source or other electrical device having a voltage to be measured.

Figure 5:
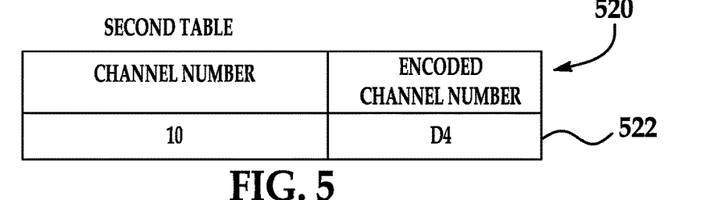
FIG. 5 is a second table that is utilized by the first monitoring application of the voltage monitoring system of FIG. 1.

Referring to FIG. 5, a second table 520 that is utilized by the first monitoring application 398 in the voltage monitoring system 120 is illustrated. The second table 520 includes a record 522. The record 522 has a second channel number 10 (which is the decimal value) and a second encoded channel number D4 (which is a hexadecimal value). The second channel number 10 is associated with the common channel 10 (of the common channel 431) in the first bank of channels 420. The second encoded channel number D4 is associated with the common channel 10 (of the common channel 431) in the first bank of channels 420.

Referring to FIG. 6, a third table 540 that is utilized by the first monitoring application 398 in the voltage monitoring system 120 is illustrated. The third table 540 includes a record 542. The record 542 has a first expected encoded channel number D4 (which is a hexadecimal value) and a second expected encoded channel number 71 (which is a hexadecimal value). The first expected encoded channel number D4 is associated with the common channel 10 (of the common channel 431) in the first bank of channels 420. The second expected encoded channel number 71 is associated with the common channel 2 (of the common channel 431) in the second bank of channels 422.

Figure 7:
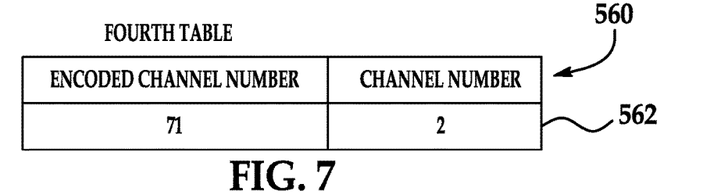
FIG. 7 is a fourth table that is utilized by a second monitoring application of the voltage monitoring system of FIG. 1.

Referring to FIG. 7, a fourth table 560 that is utilized by the second monitoring application 400 in the voltage monitoring system 120 is illustrated. The fourth table 560 includes a record 562. The record 562 has a third encoded channel number 71 (which is a hexadecimal value) and a third channel number 2 (which is the decimal value). The third encoded channel number 71 is associated with the common channel 2 (of the common channel 431) in the second bank of channels 422. The third channel number 2 is associated with the common channel 2 (of the common channel 431) in the second bank of channels 422. In an alternative embodiment, the common channel 2 in the second bank of channels 420 could be electrically coupled to another voltage source or other electrical device having a voltage to be measured.

Figure 8:
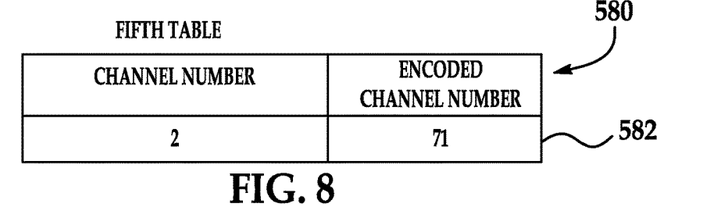
FIG. 8 is a fifth table that is utilized by the second monitoring application of the voltage monitoring system of FIG. 1.

Referring to FIG. 8, a fifth table 580 that is utilized by the second monitoring application 400 in the voltage monitoring system 120 is illustrated. The fifth table 580 includes a record 582. The record 582 has a fourth channel number 2 (which is the decimal value) and a fourth encoded channel number 71 (which is a hexadecimal value). The fourth channel number 2 is associated with the common channel 2 (of the common channel 431) in the second bank of channels 422. The fourth encoded channel number 71 is associated with the common channel 2 (of the common channel 431) in the second bank of channels 422.

Figure 9:
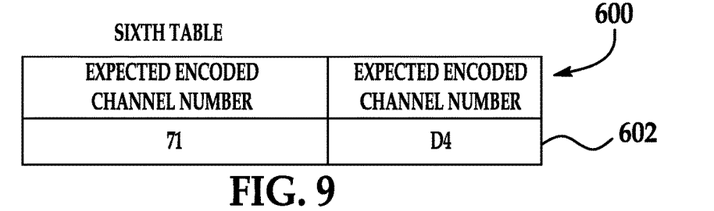
FIG. 9 is a sixth table that is utilized by the second monitoring application of the voltage monitoring system of FIG. 1.

Referring to FIG. 9, a sixth table 600 that is utilized by the second monitoring application 400 in the voltage monitoring system 120 is illustrated. The sixth table 600 includes a record 602. The record 602 has a third expected encoded channel number 71 (which is a hexadecimal value) and a fourth expected encoded channel number D4 (which is a hexadecimal value). The third expected encoded channel number 71 is associated with the common channel 2 (of the common channel 431) in the second bank of channels 422. The fourth expected encoded channel number D4 is associated with the common channel 10 (of the common channel 431) in the first bank of channels 420.

Referring to FIGS. 1, 3-9, and 11-17, a flowchart of a method for obtaining voltage measurements utilizing the voltage monitoring system 120 will now be explained. The following method is implemented utilizing the main application 397, the first monitoring application 398, the second monitoring application 400, and the hardware abstraction layer 402.

Figure 11:
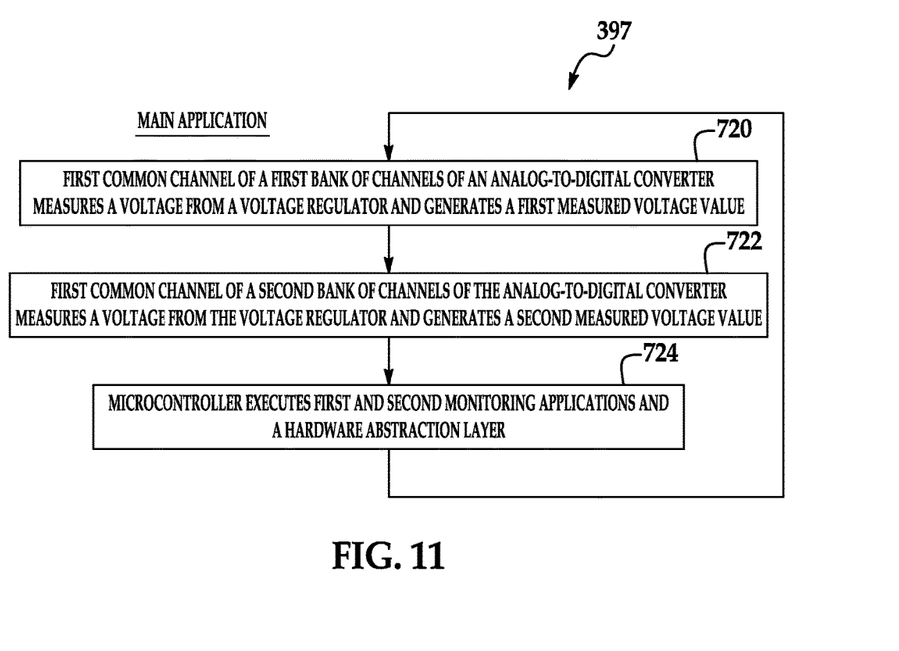
FIGS. 11-17 is a flowchart of a method for obtaining voltage measurements utilizing the voltage monitoring system of FIG. 1.

The main application 397 will now be explained.

At step 720, a first common channel (e.g., 10) of the first bank of channels 420 of an analog-to-digital converter 390 measures a voltage from a voltage regulator 50 and generates a first measured voltage value. After step 720, the method advances to step 722.

At step 722, a first common channel (e.g., 2) of the second bank of channels 422 of the analog-to-digital converter 390 measures a voltage from the voltage regulator 50 and generates a second measured voltage value. After step 722, the method advances to step 724.

At step 724, the microcontroller 380 executes first and second monitoring applications 398, 400 and a hardware abstraction layer 402. The first and second monitoring applications 398, 400 are executed simultaneously and in parallel to one another. After step 724, the method returns to step 720.

The first monitoring application 398 will now be explained.

At step 750, the first monitoring application 398 sends a first request message to the hardware abstraction layer 402 that requests the first measured voltage value from the first common channel (e.g., 10) of the first bank of channels 420. The first request message has a first encoded channel number (e.g., D4) associated with the first common channel (e.g., 10) of the first bank of channels 420. After step 750, the method advances to step 752.

At step 752, the hardware abstraction layer 402 determines a first channel number (e.g., 10) by reading a first record 502 of a first table 504 (shown in FIG. 4) stored in the memory device 396 utilizing the first encoded channel number (e.g., D4) as an index. The first channel number 10 is associated with the first common channel (e.g., 10) of the first bank of channels 420. The first record 502 of the first table 500 has the first encoded channel number (e.g., D4) and the first channel number (e.g., 10) therein. After step 752, the method advances to step 754.

At step 754, the hardware abstraction layer 402 obtains the first measured voltage value associated with the first channel number (e.g., 10) from the first common channel (e.g., 10) of the first bank of channels 420 of the analog-to-digital converter 390. After step 754, the method advances to step 756.

At step 756, the hardware abstraction layer 402 determines a second encoded channel number (e.g., D4) by reading a first record 522 of a second table 520 stored in the memory device 396 utilizing the first channel number (e.g., 10) from the first table 500 as an index. The first record 522 of the second table 520 has a second channel number (e.g., 10) and the second encoded channel number (e.g., D4) therein. The second channel number (e.g., 10) is equal to the first channel number (e.g., 10). After step 756, the method advances to step 758.

At step 758, the hardware abstraction layer 402 sends a first response message having the second encoded channel number (e.g., D4) and the first measured voltage value therein to the first monitoring application 398. After step 758, the method advances to step 770.

Figure 12:
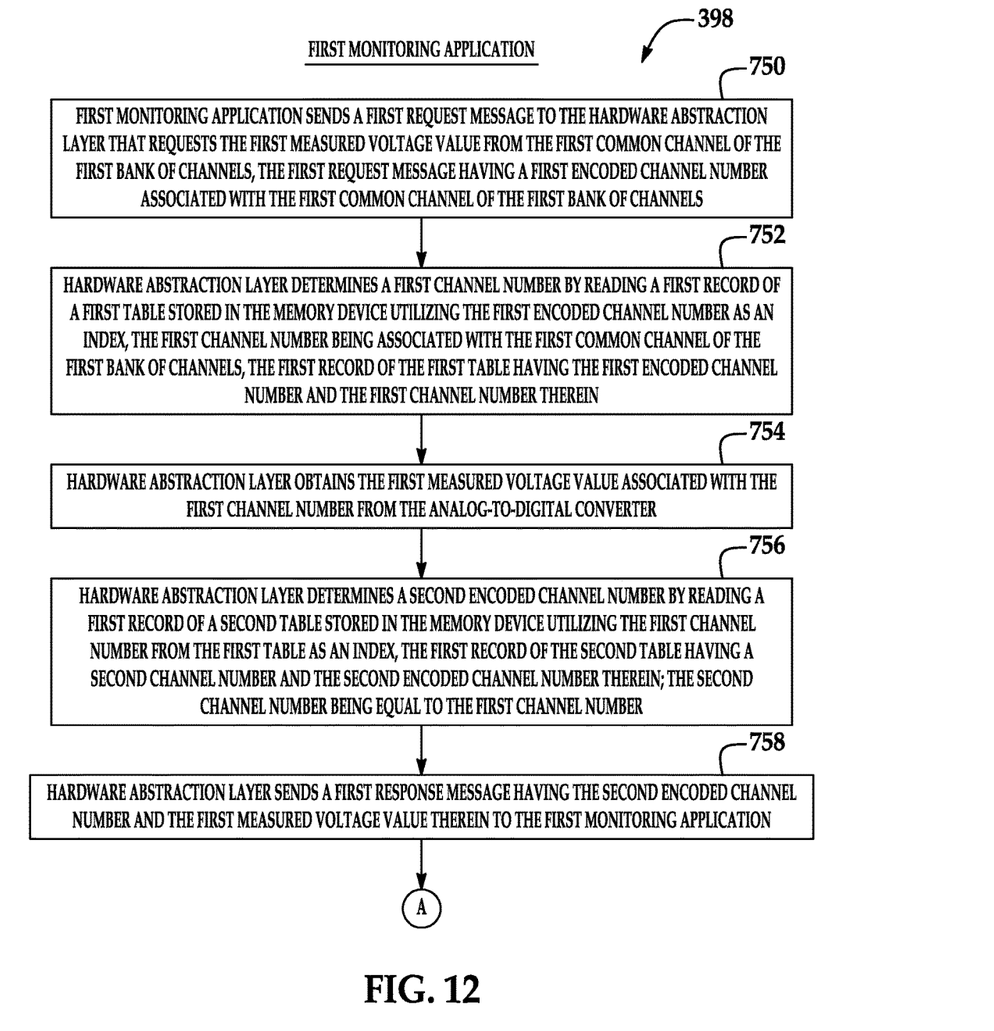

At step 770, the first monitoring application 398 sends a first exchanged message having the second encoded channel number (e.g., D4) to the second monitoring application 400. After step 770, the method advances to step 772.

At step 772, the first monitoring application 398 receives a second exchanged message having a fourth encoded channel number (e.g., 71) from the second monitoring application 400. After step 772, the method advances to step 774.

At step 774, the first monitoring application 398 determines a first expected encoded channel number (e.g., D4) and a second expected encoded channel number (e.g., 71) by reading a first record 542 of a third table 540 stored in the memory device 396 utilizing the first encoded channel number (e.g., D4) as index. The first record 542 of the third table 540 has the first expected encoded channel number (e.g., D4) and the second expected encoded channel number (e.g., 71) therein. After step 774, the method advances to step 776.

At step 776, the microcontroller 380 makes a determination as to whether the second encoded channel number (e.g., D4) is equal to the first expected encoded channel number (e.g., D4), and whether the fourth encoded channel number (e.g., 71) is equal to the second expected encoded channel number (e.g., 71). If the value of step 776 equals "yes", the method advances to step 778. Otherwise, the method advances to step 780.

At step 778, the first monitoring application 398 stores the first measured voltage value in a memory device 396 as a first valid voltage value. After step 778, the method advances to step 798.

Referring again to step 776, if the value of step 776 equals "no", the method advances to step 780. At step 780, the first monitoring application 398 sends a third exchanged message to the second monitoring application 400 requesting the second measured voltage value. After step 780, the method advances to step 782.

At step 782, the first monitoring application 398 receives a fourth exchanged message having the second measured voltage value from the second monitoring application 400. After step 782, the method advances to step 790.

Figure 13:
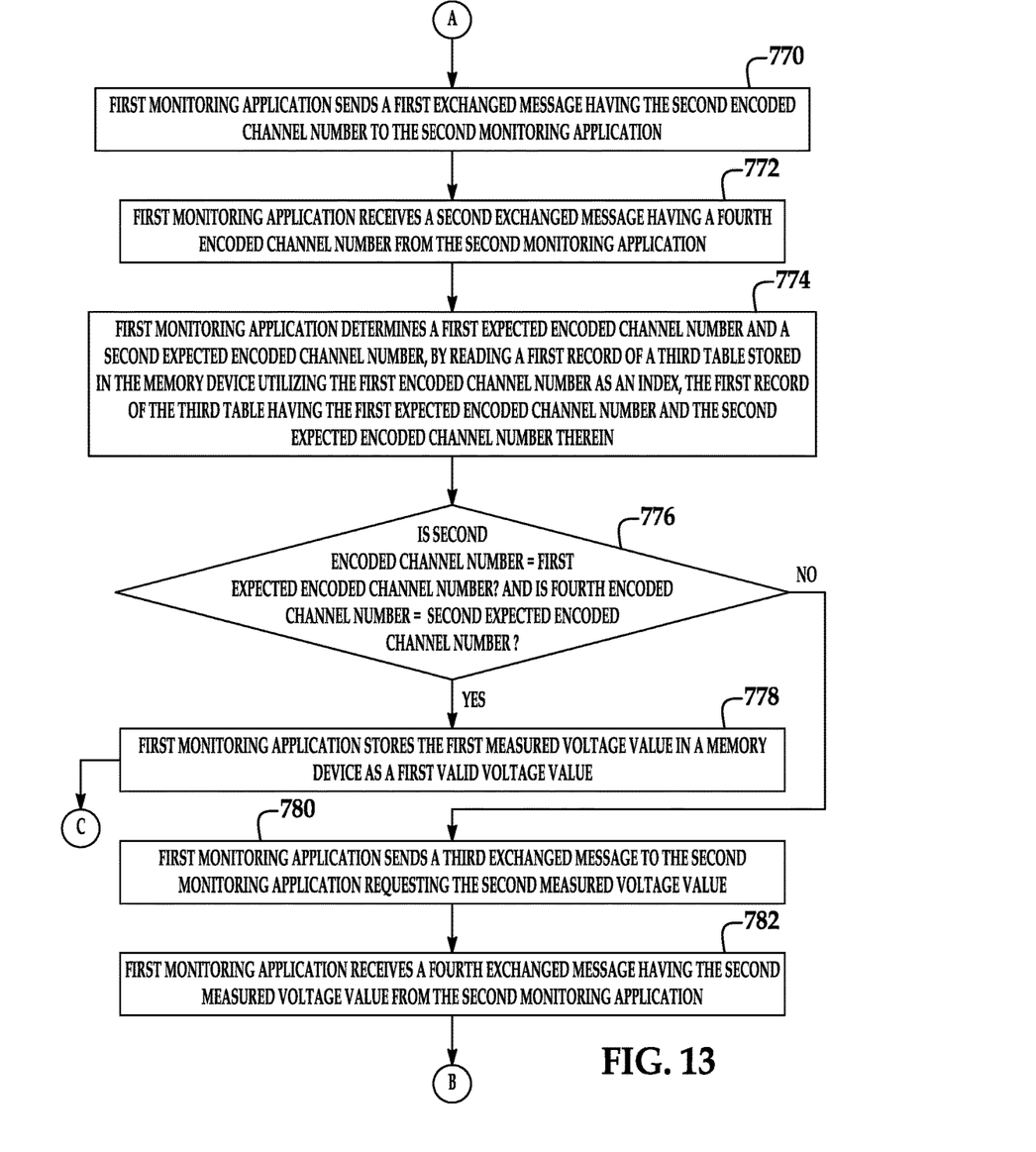

At step 790, the microcontroller 380 makes a determination as to whether an absolute value of a difference between the first and second measured voltage values is less than or equal to a first difference value. If the value of step 790 equals "yes", the method advances to step 792. Otherwise, the method advances to step 794.

At step 792, the first monitoring application 398 stores the first measured voltage value in the memory device 396 as the first valid voltage value. After step 792, the method advances to step 798.

Referring again to step 790, if the value of step 790 equals "no", the method advances to step 794. At step 794, the first monitoring application 398 commands the microcontroller 380 to generate control signals to transition a contactor 70 to an open operational state. After step 794, the method advances to step 796.

At step 796, the first monitoring application 398 commands the microcontroller 380 to generate control signals to transition a first bi-directional switch 250 of a DC-DC voltage converter 100 to the open operational state, and to transition a second bi-directional switch 254 of the DC-DC voltage converter 100 to the open operational state. After step 796, the method advances to step 798.

At step 798, the microcontroller 380 makes a determination as to whether the first monitoring application 398 received a fifth exchanged message from the second monitoring application 400 requesting the first measured voltage value. If the value of step 790 equals "yes", the method advances to step 800. Otherwise, the method returns to the main application 397.

At step 800, the first monitoring application 398 sends a sixth exchanged message having the first measured voltage value to the second monitoring application 400. After step 800, the method returns to the main application 397.

Figure 14:
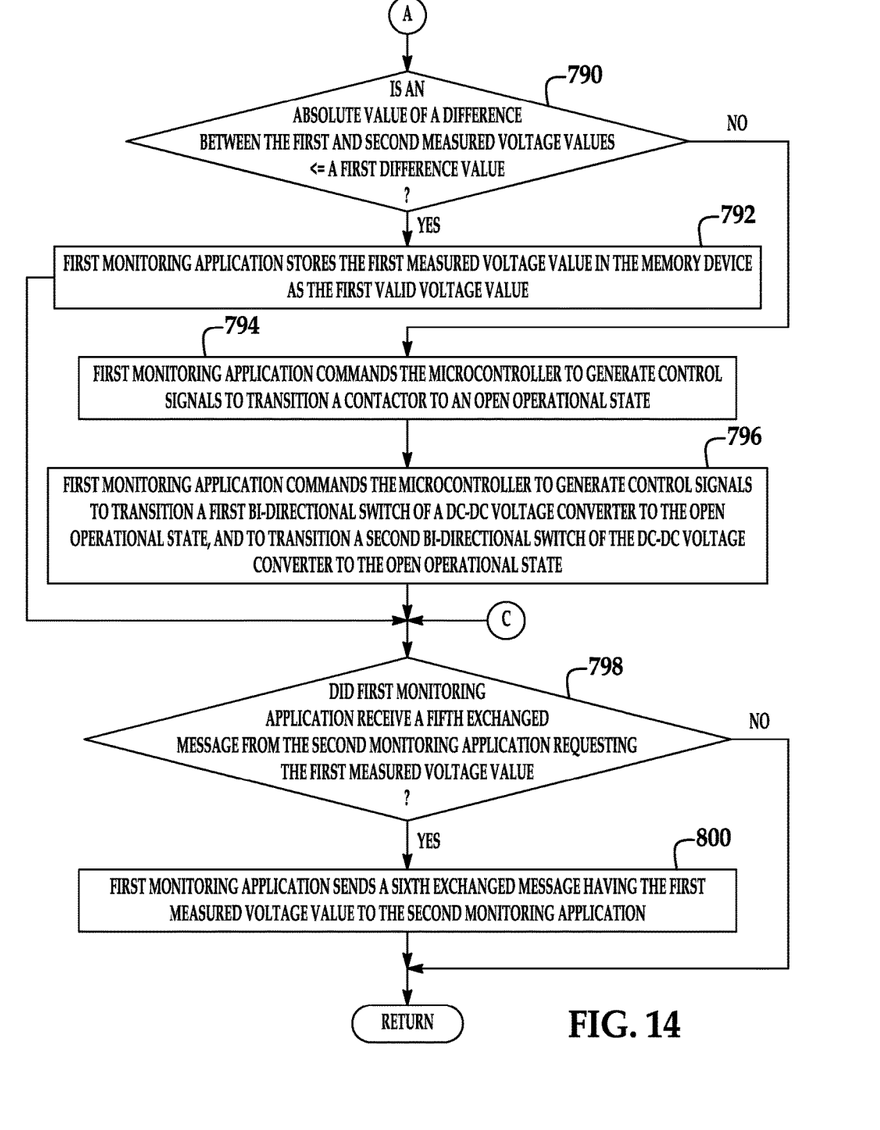

The second monitoring application 400 will now be explained.

At step 850, the second monitoring application 400 sends a second request message to the hardware abstraction layer 402 that requests the second measured voltage value from the first common channel (e.g., 2) of the second bank of channels 422. The second request message has a third encoded channel number (e.g., 71) associated with the first common channel (e.g., 2) of the second bank of channels 422. After step 850, the method advances to step 852.

At step 852, the hardware abstraction layer 402 determines a third channel number (e.g., 2) by reading a first record 562 of a fourth table 560 (shown in FIG. 7) stored in the memory device 396 utilizing the third encoded channel number (e.g., 71) as an index. The third channel number (e.g., 2) is associated with the first common channel (e.g., 2) of the second bank of channels 422. The first record 562 of the fourth table 560 has the third encoded channel number (e.g., 71) and the third channel number (e.g., 2) therein. After step 852, the method advances to step 854.

At step 854, the hardware abstraction layer 402 obtains the second measured voltage value associated with the second channel number (e.g., 2) from the first common channel (e.g., 2) of the second bank of channels 422 of the analog-to-digital converter 390. After step 854, the method advances to step 856.

At step 856, the hardware abstraction layer 402 determines a fourth encoded channel number (e.g., 71) by reading a first record 582 of the fifth table 580 (shown in FIG. 8) stored in the memory device 396 utilizing the third channel number (e.g., 2) from the fourth table 560 as an index. The first record 582 of the fifth table 580 has a fourth channel number (e.g., 2) and the fourth encoded channel number (e.g., 71) therein. After step 856, the method advances to step 858.

At step 858, the hardware abstraction layer 402 sends a second response message having the fourth encoded channel number (e.g., 71) and the second measured voltage value therein to the first monitoring application 398. After step 858, the method advances to step 870.

Figure 15:
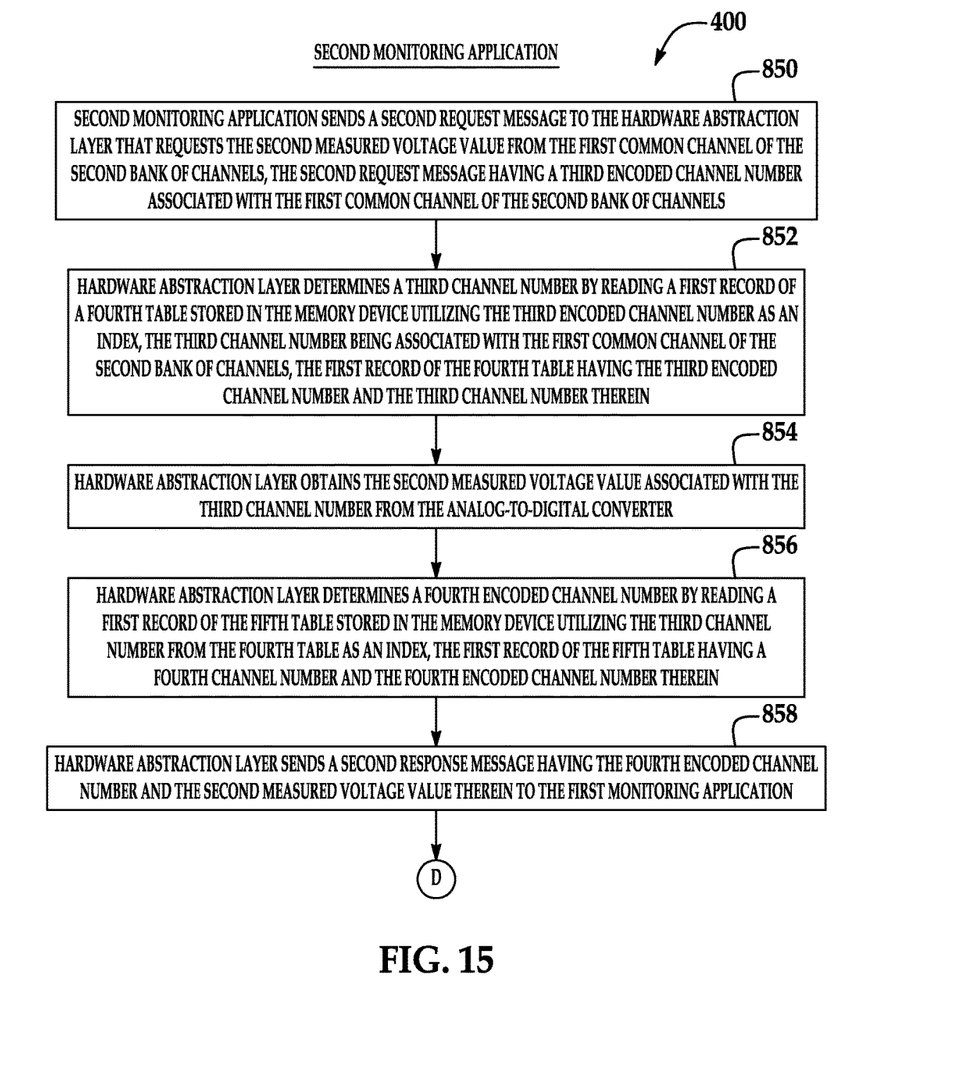

At step 870, the second monitoring application 400 sends the second exchanged message having the fourth encoded channel number (e.g., 71) to the first monitoring application 398. After step 870, the method advances to step 872.

At step 872, the second monitoring application 400 receives the first exchanged message having the second encoded channel number (e.g., D4) from the first monitoring application 398. After step 872, the method advances to step 874.

At step 874, the second monitoring application 400 determines a third expected encoded channel number (e.g., 71) and a fourth expected encoded channel number (e.g., D4), by reading a first record 602 of a sixth table 600 stored in the memory device 396 utilizing the third encoded channel number (e.g., 71) as index. The first record 602 of the sixth table 600 has the third expected encoded channel number (e.g., 71) and the fourth expected encoded channel number (e.g., D4) therein. After step 874, the method advances to step 876.

At step 876, the microcontroller 380 makes a determination as to whether the second encoded channel number (e.g., D4) is equal to the fourth expected encoded channel number (e.g., D4), and whether the fourth encoded channel number (e.g., 71) is equal to the third expected encoded channel number (e.g., 71). If the value of step 876 equals "yes", the method advances to step 878. Otherwise, the method advances to step 880.

At step 878, the second monitoring application 400 stores the second measured voltage value in a memory device 396 as a second valid voltage value. After step 878, the method advances to step 898.

Referring again to step 876, if the value of step 876 equals "no", the method advances to step 880. At step 880, the second monitoring application 400 sends a fifth exchanged message to the first monitoring application 398 requesting the first measured voltage value. After step 880, the method advances to step 882.

At step 882, the second monitoring application 400 receives a sixth exchanged message having the first measured voltage value from the first monitoring application 398. After step 882, the method advances to step 890.

Figure 16:
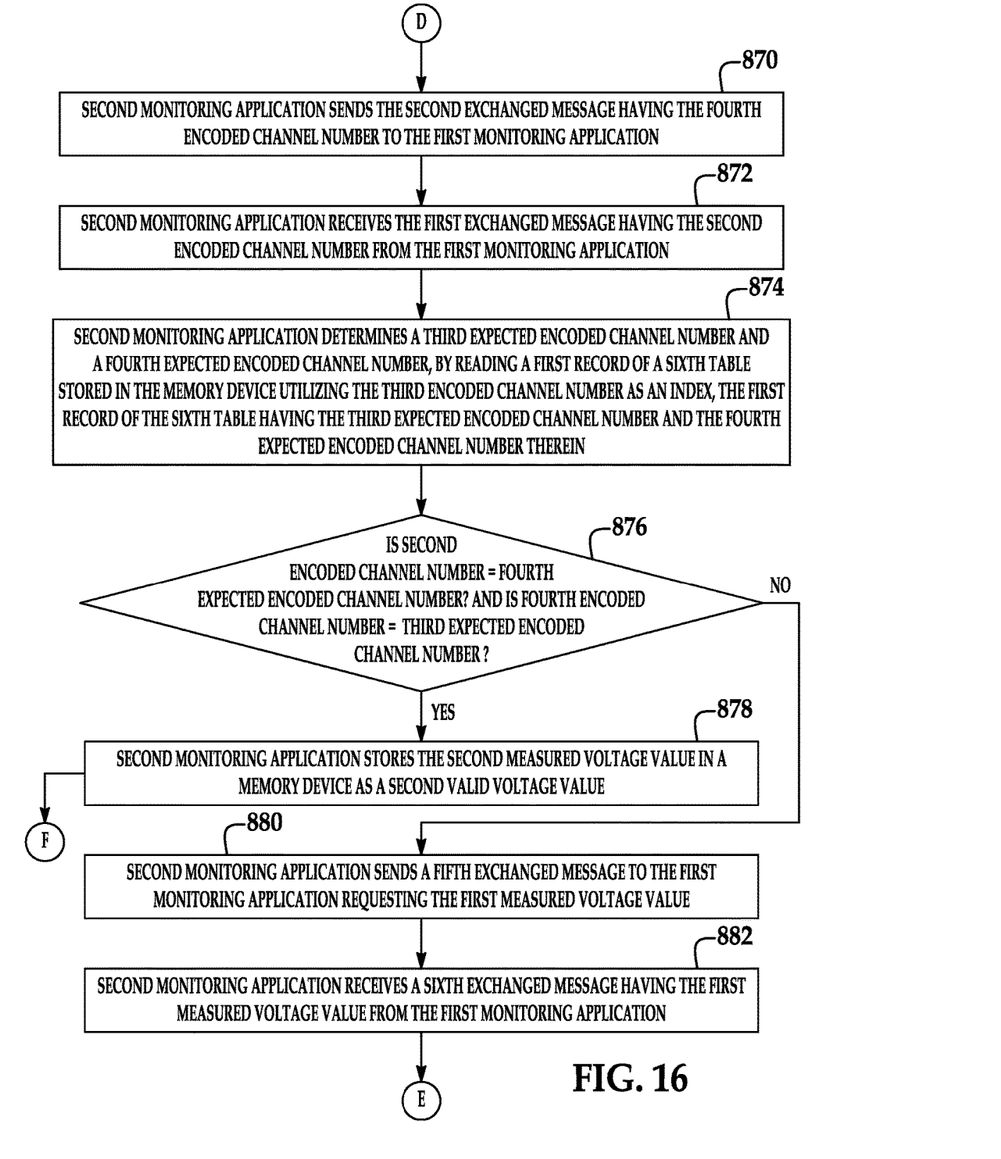

At step 890, the microcontroller 380 makes a determination as to whether an absolute value of a difference between the first and second measured voltage values is less than or equal to a first difference value. If the value of step 890 equals "yes", the method advances to step 892. Otherwise, the method advances to step 894.

At step 892, the second monitoring application 400 stores the second measured voltage value in the memory device 396 as the second valid voltage value. After step 892, the method advances to step 898.

Referring again to step 890, if the value of step 890 equals "no", the method advances to step 894. At step 894, the second monitoring application 400 commands the microcontroller 380 to generate control signals to transition a contactor 70 to an open operational state. After step 894, the method advances to step 896.

Figure 17:
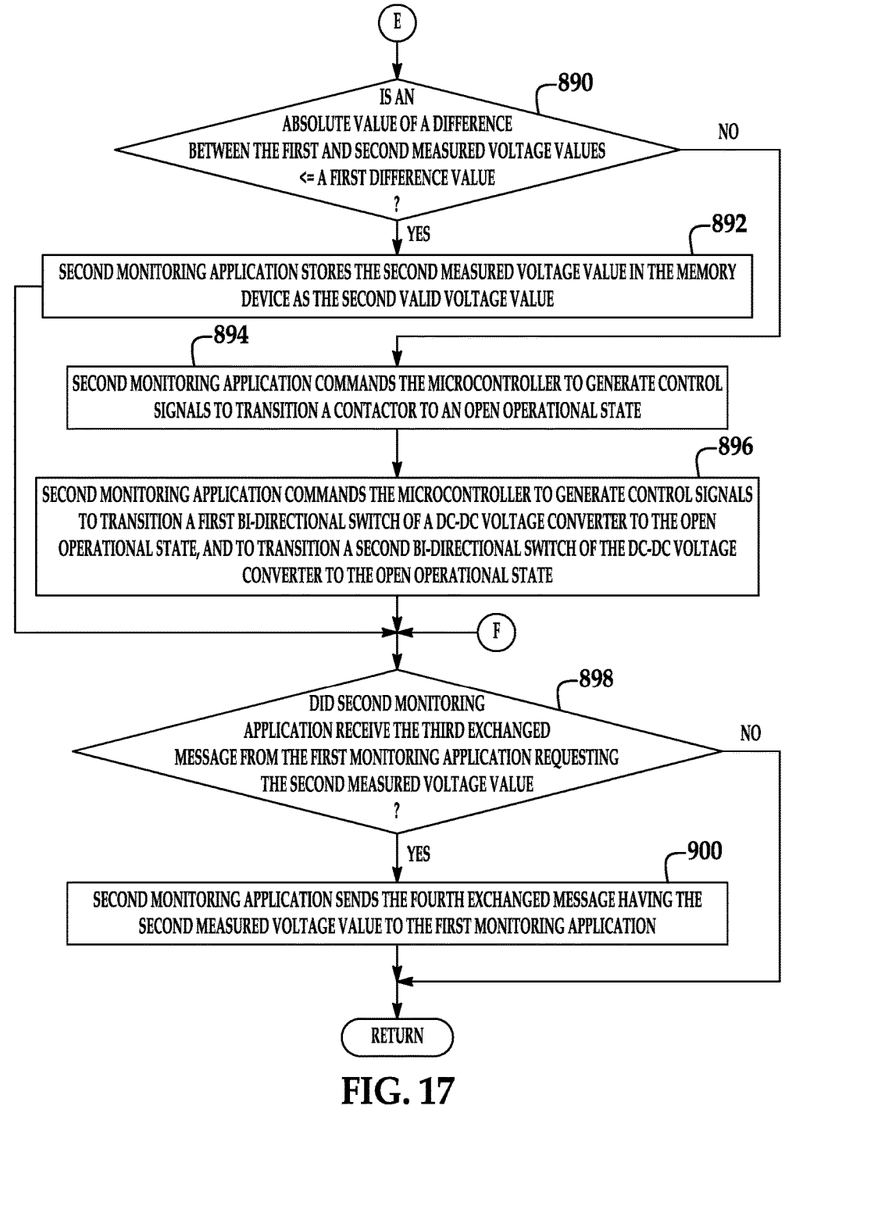

At step 896, the second monitoring application 400 commands the microcontroller 380 to generate control signals to transition a first bi-directional switch 250 of a DC-DC voltage converter 100 to the open operational state, and to transition a second bi-directional switch 254 of the DC-DC voltage converter 100 to the open operational state. After step 896, method advances to step 898.

At step 898, the microcontroller 380 makes a determination as to whether the second monitoring application 400 received the third exchanged message from the first monitoring application 398 requesting the second measured voltage value. If the value of step 898 equals "yes", the method advances to step 900. Otherwise, the method returns to the main application 397.

At step 900, the second monitoring application 400 sends the fourth exchanged message having the second measured voltage value to the first monitoring application 398. After step 900, the method returns to the main application 397.

The voltage monitoring system 120 described herein provides a substantial advantage over other systems. In particular, the voltage monitoring system 120 utilizes first and second monitoring applications that exchange encoded channel numbers with one another that are associated with a first common channel in a first bank of channels and a first common channel in a second bank of channels, respectively, of an analog-to-digital converter 390 to confirm that the first and second monitoring applications are reliably obtaining desired voltage values from the first common channel in the first bank of channels and the first common channel in the second bank of channels, respectively, which are electrically coupled together.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A voltage monitoring system, comprising:
a microcontroller having first and second applications, a hardware abstraction layer, and an analog-to-digital converter with a first bank of channels including a first common channel, and a second bank of channels including a first common channel electrically coupled to the first common channel of the first bank of channels;
the first application sending a first request message to the hardware abstraction layer utilizing a call instruction that requests a first voltage value from the first common channel of the first bank of channels, the first request message having a first encoded channel number associated with the first common channel of the first bank of channels;
the hardware abstraction layer determining a first channel number by reading a first record of a first table stored in a memory device utilizing the first encoded channel number as an index, the first record of the first table having the first encoded channel number and the first channel number therein, the first channel number being associated with the first common channel of the first bank of channels;
the hardware abstraction layer obtaining the first voltage value from the first common channel of the first bank of channels;
the hardware abstraction layer sending a first response message having a second encoded channel number and the first voltage value to the first application;
the first application sending a first exchanged message having the second encoded channel number to the second application;
the second application sending a second request message to the hardware abstraction layer that requests a second voltage value from the first common channel of the second bank of channels, the second request message having a third encoded channel number associated with the first common channel of the second bank of channels;
the hardware abstraction layer determining a second channel number by reading a first record of a second table stored in the memory device utilizing the third encoded channel number as an index, the first record of the second table having the third encoded channel number and the second channel number therein;
the hardware abstraction layer obtaining the second voltage value from the first common channel of the second bank of channels;
the hardware abstraction layer sending a second response message having a fourth encoded channel number and the second voltage value to the second application; and
the second application storing the second voltage value in the memory device as a first valid voltage value if the fourth encoded channel number is equal to a first expected encoded channel number, and the second encoded channel number from the first application is equal to a second expected encoded channel number.

2. The voltage monitoring system of claim 1, wherein the second application sending a third exchanged message to the first application requesting the first voltage value if either the fourth encoded channel number is not equal to the first expected encoded channel number, or the second encoded channel number from the first application is not equal to the second expected encoded channel number;
the first application sending a fourth exchanged message having the first voltage value to the second application, in response to receiving the third exchanged message; and
the second application storing the second voltage value in the memory device as the first valid voltage value if a difference between the first and second voltage values is less than or equal to a first difference value.

3. The voltage monitoring system of claim 2, wherein:
the second application commanding the microcontroller to generate control signals to transition a contactor to an open operational state, if the difference between the first and second voltage values is greater than the first difference value.

4. The voltage monitoring system of claim 3, wherein:
the second application commanding the microcontroller to generate control signals to transition a first bi-directional switch of a DC-DC voltage converter to the open operational state, and to transition a second bi-directional switch of the DC-DC voltage converter to the open operational state, if the difference between the first and second voltage values is greater than the first difference value.

5. The voltage monitoring system of claim 1, wherein the first application storing the first voltage value in the memory device as a second valid voltage value if the second encoded channel number is equal to a third expected encoded channel number, and the fourth encoded channel number is equal to a fourth expected encoded channel number.

6. The voltage monitoring system of claim 5, wherein the first application sending a third exchanged message to the second application requesting the second voltage value if either the second encoded channel number is not equal to a third expected encoded channel number, or the fourth encoded channel number from the second application is not equal to a fourth expected encoded channel number;

the second application sending a fourth exchanged message having the second voltage value to the first application, in response to receiving the third exchanged message; and the first application storing the first voltage value in the memory device as the second valid voltage value if a difference between the first and second voltage values is less than a first difference value.

7. The voltage monitoring system of claim 6, wherein:
the first application commanding the microcontroller to generate control signals to transition a contactor to an open operational state, if the difference between the first and second voltage values is greater than the first difference value.

8. The voltage monitoring system of claim 7, wherein:
the first application commanding the microcontroller to generate control signals to transition a first bi-directional switch of a DC-DC voltage converter to the open operational state, and to transition a second bi-directional switch of the DC-DC voltage converter to the open operational state, if the difference between the first and second voltage values is greater than the first difference value.

9. The voltage monitoring system of claim 1, wherein:
the hardware abstraction layer determining the second encoded channel number by reading a first record of a third table stored in the memory device utilizing the first channel number from the first table as an index, the first record of the third table having a third channel number and the second encoded channel number therein; the third channel number being equal to the first channel number.

10. The voltage monitoring system of claim 9, wherein the second application determining the first expected encoded channel number and the second expected encoded channel number, by reading a first record of a fourth table stored in the memory device utilizing the third encoded channel number as index, the first record of the fourth table having the first expected encoded channel number and the second expected encoded channel number therein.

11. The voltage monitoring system of claim 1, wherein the first encoded channel number is a hexadecimal value.

12. The voltage monitoring system of claim 11, wherein the hexadecimal value is 1-byte in length.

13. The voltage monitoring system of claim 1, wherein the second encoded channel number is a hexadecimal value.

14. The voltage monitoring system of claim 13, wherein the hexadecimal value is 1-byte in length.

15. The voltage monitoring system of claim 1, wherein the first encoded channel number and the second encoded channel number have a Hamming distance of four from one another.

16. A voltage monitoring system, comprising:
a microcontroller having a hardware abstraction layer, and an analog-to-digital converter with a first bank of channels including a first common channel, and a second bank of channels including a first common channel electrically coupled to the first common channel of the first bank of channels;

the hardware abstraction layer determining a first channel number by reading a first record of a first table stored in a memory device utilizing a first encoded channel number as an index, the first record of the first table having the first encoded channel number and the first channel number therein, the first channel number being associated with the first common channel of the first bank of channels;

the hardware abstraction layer obtaining a first voltage value from the first common channel of the first bank of channels;

the hardware abstraction layer determining a second channel number by reading a first record of a second table stored in the memory device utilizing a second encoded channel number as an index, the first record of the second table having the second encoded channel number and the second channel number therein, the second channel number being associated with the first common channel of the second bank of channels; and the hardware abstraction layer obtaining a second voltage value from the first common channel of the second bank of channels.

17. The voltage monitoring system of claim 16, wherein the first encoded channel number is a hexadecimal value, and the second encoded channel number is a hexadecimal value.

18. The voltage monitoring system of claim 17, wherein the first encoded channel number and the second encoded channel number have a Hamming distance of four from one another.

* * * * *